(12) United States Patent
Kim

(10) Patent No.: US 7,572,728 B2
(45) Date of Patent: Aug. 11, 2009

(54) SEMICONDUCTOR DEVICE AND METHOD FOR MANUFACTURING THE SAME

(75) Inventor: Tae Woo Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 222 days.

(21) Appl. No.: 11/616,257

(22) Filed: Dec. 26, 2006

(65) Prior Publication Data

US 2007/0148961 A1   Jun. 28, 2007

(30) Foreign Application Priority Data

Dec. 28, 2005   (KR) .................. 10-2005-0132374

(51) Int. Cl.
  *H01L 21/4763*  (2006.01)
  *H01L 29/40*  (2006.01)
(52) U.S. Cl. .................. 438/624; 438/637; 438/638; 257/758; 257/760; 257/762
(58) Field of Classification Search .................. 438/622, 438/624, 629, 637, 638, 672; 257/750, 758, 257/759, 760, 762
See application file for complete search history.

(56) References Cited

U.S. PATENT DOCUMENTS

| | | | | |
|---|---|---|---|---|
| 6,103,616 | A * | 8/2000 | Yu et al. .................. | 438/622 |
| 6,372,653 | B1 * | 4/2002 | Lou et al. .................. | 438/706 |
| 6,767,827 | B1 * | 7/2004 | Okada et al. ............... | 438/638 |
| 2003/0219973 | A1 * | 11/2003 | Townsend et al. .......... | 438/631 |
| 2006/0019491 | A1 * | 1/2006 | Soda .......................... | 438/638 |
| 2006/0063393 | A1 * | 3/2006 | Shaffer et al. .............. | 438/780 |

* cited by examiner

*Primary Examiner*—Kevin M Picardat
(74) *Attorney, Agent, or Firm*—Sherr & Vaughn, PLLC

(57) ABSTRACT

A semiconductor device and method with a dual damascene pattern uses buffer layers to prevent photoresist layer poisoning due to a reaction between an interlayer dielectric and a photoresist layer. Embodiments also relate to reducing the effects of plasma damage occurring during an etching or ashing process.

11 Claims, 7 Drawing Sheets

SEMICONDUCTOR DEVICE AND METHOD FOR MANUFACTURING THE SAME

The present application claims priority under 35 U.S.C. 119 and 35 U.S.C. 365 to Korean Patent Application No. 10-2005-0132374 (filed on Dec. 28, 2005), which is hereby incorporated by reference in its entirety.

BACKGROUND

In manufacturing a semiconductor device, metal wirings are used to electrically connect devices or wirings to each other.

Although aluminum Al or tungsten W may be used as materials for metal wiring, they have a low melting point and high resistivity. Accordingly, it is difficult to apply aluminum Al or tungsten W to a highly integrated semiconductor device. As the degree of integration in semiconductor devices escalates, a demand for a material having low resistivity and excellent reliability including high electro-migration (referred to as 'EM') and stress-migration (referred to as 'SM'). Recently, copper has been considered the most suitable material to meet the demand.

However, wiring processes using copper have problems with etching and increased corrosion. It is very difficult to substitute copper into the type of wiring processes used on aluminum and tungsten.

To overcome this, a single damascene or dual damascene process may be applied. In particular, the dual damascene process has found favor. A via first dual damascene (referred to as 'VFDD' hereinafter), a trench first dual damascene (referred to as 'TFDD' hereinafter), and a self-align dual damascene (referred to as 'SADD' hereinafter) are alternatives of dual damascene processes.

FIGS. 1A through 1E are views illustrating a method for manufacturing a semiconductor device with a dual damascene pattern according to the related art. As shown in FIG. 1A, a first interlayer dielectric 30 is formed over a substrate 10 on which a lower metal wiring 20 is formed. Next, a capping layer 40 is formed over the first interlayer dielectric 30 including the lower metal wiring 20, and a second interlayer dielectric 50 is formed over the capping layer 40.

As shown in FIG. 1A, a via hole pattern is formed and etched on the second interlayer dielectric 50 using a photoresist layer (not shown) to form a via hole H1. An ashing process, using plasma generated by RF or microwaves, removes the photoresist material forming the via hole pattern.

As shown in FIG. 1B, the via hole H1 is filled with a first photoresist layer 60. As shown in FIG. 1C, photoresist layer 60 is removed, except the photoresist inside the via hole H1. The remaining photoresist will be used during a subsequent process as an etch barrier.

As shown in FIG. 1D, a second photoresist layer 70 is deposited, exposed, and developed over the second interlayer dielectric 50, to form a trench pattern T1.

However, a reaction between the second interlayer dielectric 50 and the first photoresist layer 60 causes photoresist poisoning. Photoresist poisoning causes an upper portion of the first photoresist layer 60 to become swollen.

Photoresist poisoning indicate that components of an upper portion of the first photoresist layer 60 react with components in the second interlayer dielectric 50, which has a low dielectric constant, as shown with A of FIG. 1D.

A trench is formed by using the second photoresist layer 70 as an etch mask and the first photoresist layer 60 as an etch stop layer.

Then, as shown in FIG. 1E, the first photoresist layer 60 is removed by ashing. After the capping layer 40 is etched to expose metal wiring 20, the via hole and trench are filled with copper to simultaneously form a via plug 80 and a lower metal wiring 90.

However, as shown in FIG. 1E, the poisoning A of the first photoresist causes the etch of the second interlayer dielectric 50 to leave behind a residual part A'. This causes a shape of the lower metal wiring 90 to be distorted, resulting in increased resistance of the metal wiring.

Moreover, the etching and ashing processes use high intensity plasma during various stages of the metal wiring process. When high intensity plasma is used, a strong electric field between the gate and substrate of the semiconductor device can cause plasma damage to the gate insulating layer. This may be characterized as significant charge damage.

The damage in the gate insulating layer may change the threshold voltage, reduce the duration of a conductance of a gate insulating layer, or damp a drain current, all of which result in degraded operation of the semiconductor device.

In addition, the plasma damage occurs during a plasma etching process for forming trenches, an ashing process for removing a photoresist layer, and a plasma etching process for removing a via etch stop layer.

SUMMARY

Accordingly, embodiments are directed to a method of fabricating a trench isolation layer in a semiconductor device that substantially obviates one or more problems due to limitations and disadvantages of the related art.

Embodiments relate to a semiconductor device with a dual damascene pattern and a method for manufacturing the same, which may prevent photoresist layer poisoning due to a reaction between an interlayer dielectric and a photoresist layer. Embodiments also relate to reducing the effects of plasma damage occurring during an etch or ashing process.

Additional advantages, objects, and features of the embodiments will be set forth in part in the description which follows and in part will become apparent to those having ordinary skill in the art upon examination of the following or may be learned from practical experience with the embodiments. The objectives and other advantages of the embodiments may be realized and attained by the structure particularly pointed out in the written description and claims hereof as well as the appended drawings.

To achieve these objects and other advantages and in accordance with the purpose of the embodiments, there is provided a semiconductor device including a substrate having a first interlayer dielectric layer including a lower metal wiring; a second interlayer dielectric layer formed over the first interlayer dielectric layer; a first buffer layer formed over the second interlayer dielectric layer; a third interlayer dielectric layer; a second buffer layer formed over the third interlayer dielectric layer; a hard mask formed at an upper portion of the second buffer layer; a metal via extending through the second interlayer dielectric layer and the first buffer layer; and a metal wiring layer extending through the third interlayer dielectric layer and the second buffer layer.

A capping layer may be formed between the lower metal wiring and the first interlayer dielectric layer.

The first buffer layer and the second buffer layer may be made of a material having an etching selectivity greater than that of the first, second, and third interlayer dielectric layers.

The metal may be any one selected from the group consisting of Cu, Al, Ag, Au, or W.

A method for manufacturing a semiconductor device according to embodiments may include preparing a substrate having a first interlayer dielectric layer including a lower metal wiring; forming a second interlayer dielectric layer over the first interlayer dielectric layer; forming a first buffer layer over the second interlayer dielectric layer, forming a third interlayer dielectric layer over the first buffer layer; forming a second buffer layer over the third interlayer dielectric layer; forming a hard mask over the second buffer layer; depositing and patterning a photoresist layer for defining a trench region over the hard mask; etching the hard mask using the photoresist layer as a mask to form a trench pattern; depositing and patterning a photoresist layer for defining a via hole over the second buffer layer including the hard mask; etching the second buffer layer and the third interlayer dielectric; simultaneously etching the second buffer layer using the hard mask as an etch mask and etching the first buffer layer using the third interlayer dielectric as an etch mask; and etching a third interlayer dielectric using the hard mask as an etch mask to form a trench, while etching the second interlayer dielectric using the first buffer exposed according to a formation of the trench to form a via hole.

The first exposed buffer layer may be etched after the formation of the trench and the via hole.

A capping layer between the lower metal wiring and the first interlayer dielectric may be provided, and etched after the formation of the trench and the via hole.

The trench and via hole are filled with a metal to form an upper metal wiring and metal via. The metal may be any one selected from the group consisting of Cu, Al, Ag, Au, or W.

It is to be understood that both the foregoing general description and the following detailed description of the embodiments are exemplary and explanatory and are intended to provide further explanation of the claims.

BRIEF DESCRIPTION OF THE DRAWINGS

Example

Example

DETAILED DESCRIPTION

Figure 1A:
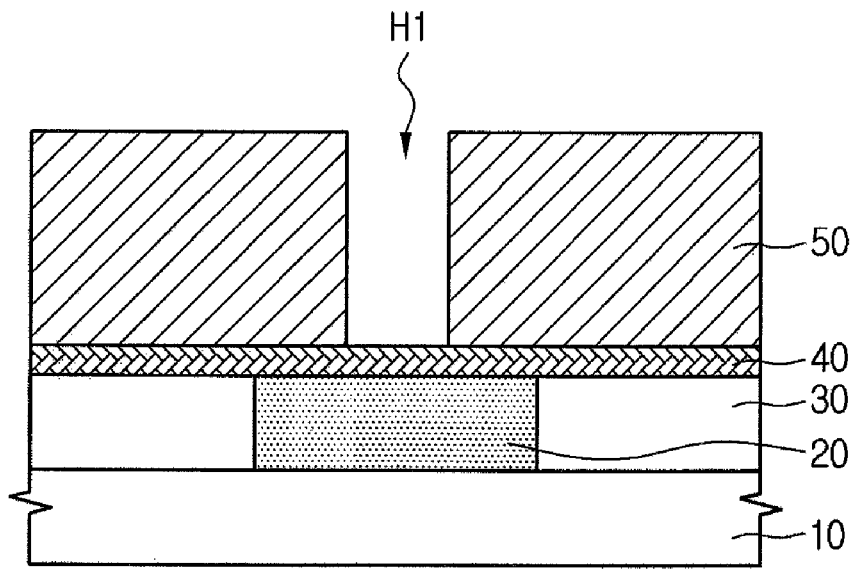
FIG. 1A through 1E are views illustrating a method for manufacturing a semiconductor device with a dual damascene pattern according to the related art.
Figure 1B:
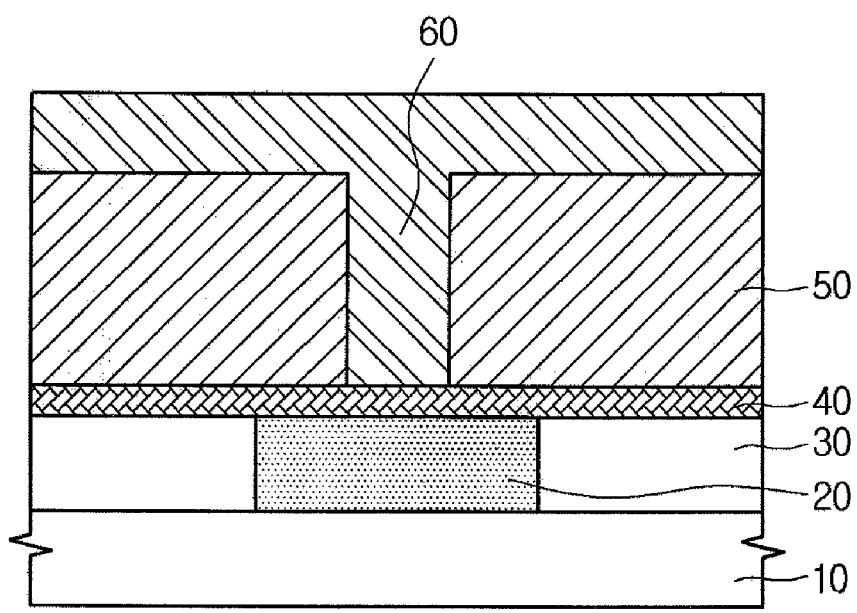
Figure 1C:
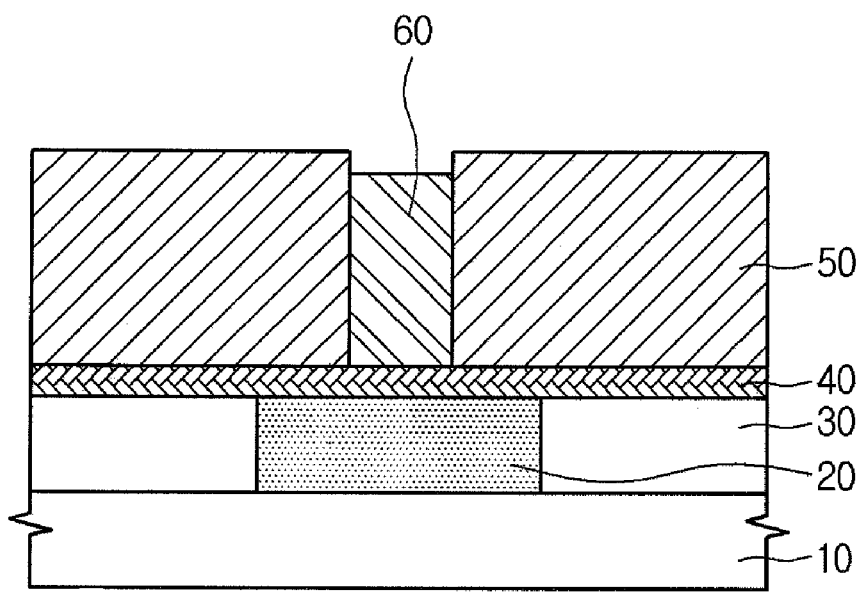
Figure 1D:
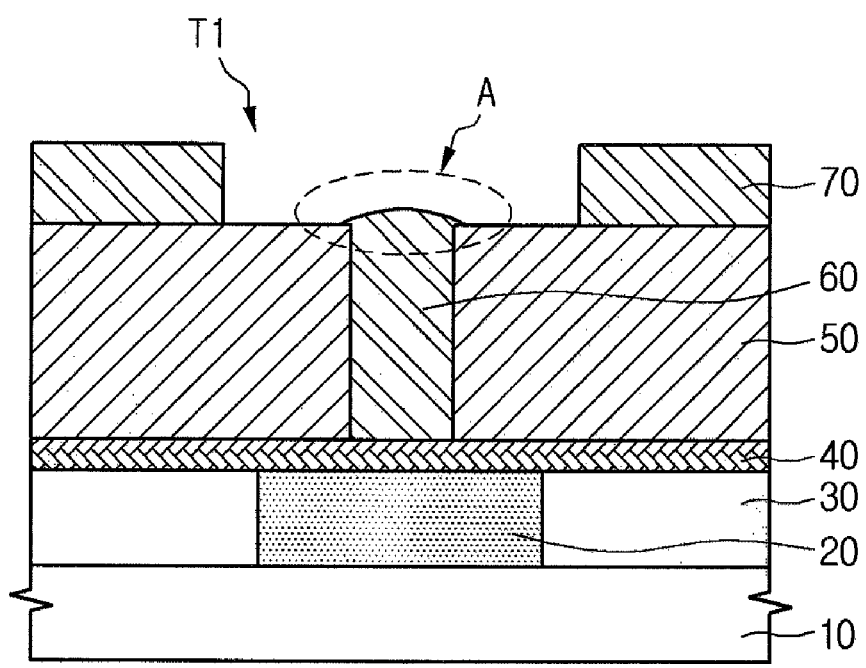
Figure 1E:
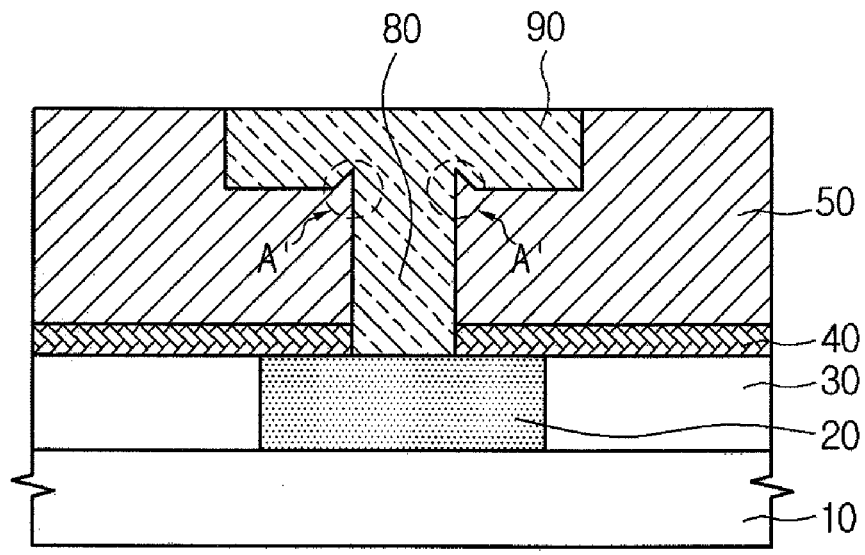
Figure 2:
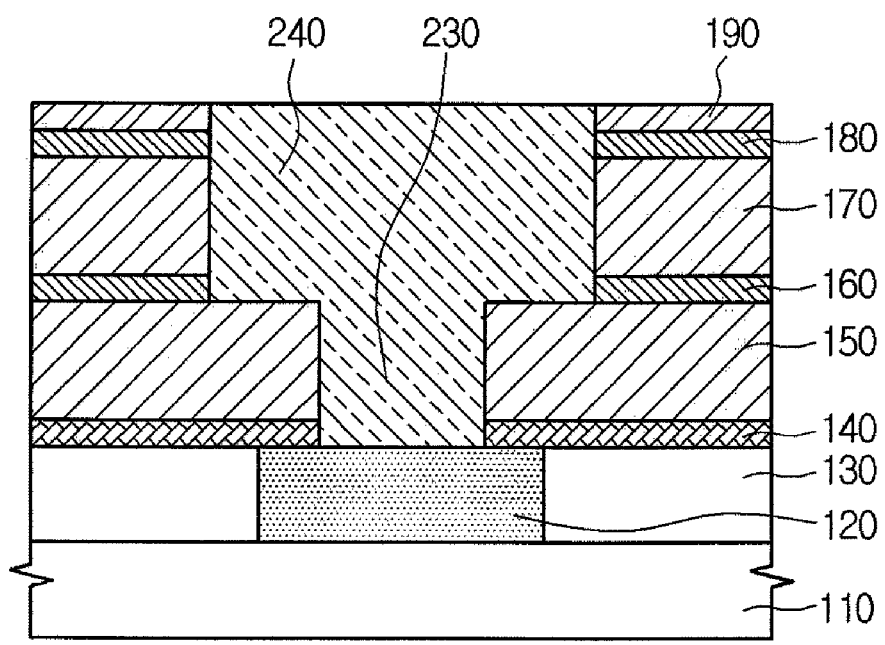
FIG. 2 is a view showing a semiconductor device with a dual damascene pattern according to embodiments.

A semiconductor device with a dual damascene pattern according to embodiments will now be explained with reference to FIG. 2.

The semiconductor device with a dual damascene pattern according to embodiments may include a substrate 110, a second interlayer dielectric 150, a first buffer layer 160, a third interlayer dielectric 170, a second buffer layer 180, a hard mask 190, a via plug 230, and an upper metal wiring 240.

A first interlayer dielectric 130 including a lower metal wiring 120 may be formed over a substrate 110. The lower metal wiring 102 may be formed of any one selected from the group consisting of Cu, Al, Ag, Au, or W. The first interlayer dielectric 130 may be made of TEOS-CVD, plasma enhanced chemical vapor deposition (PECVD)-$SiO_2$, PECVD-SiON, BPSG using TEOS, or other interlayer dielectrics.

The second interlayer dielectric 150 is formed over the first interlayer dielectric 130 including a lower metal wiring 120, and may include a predetermined via hole (not shown). The second interlayer dielectric 150 may be made of a doped CVD-$SiO_2$ layer using silane gas $SiH_4$, CVD-phospho silicate glass (PSG) doped with phosphor P, borophospho silicate glass (BPSG) using tetraethyl orthosilicate (TEOS), or other dielectrics.

The semiconductor device according to embodiments may further include a capping layer 140, formed between the lower metal wiring 120 and the first interlayer dielectric 130. The capping layer 140 functions as a barrier to metal diffusion into an interlayer dielectric. The diffusion of the metal into the interlayer dielectric degrades the interlayer dielectric. The capping layer 140 can be formed of SiN or other materials capable of suppressing a diffusion of the metal.

The first buffer layer 160 can be formed over the second interlayer dielectric 150. The first buffer layer 160 may be made of a material having an etch selectivity greater than that of the interlayer dielectric. For example, in embodiments, a nitride based material may be used in the first buffer layer 160.

According to embodiments, the first buffer layer 160 can prevent plasma damage during any etching or ashing process that uses plasma.

The third interlayer dielectric 170 may include a trench (not shown) having a width greater than that of the via hole. Here, the third interlayer dielectric 170 may be made of a doped CVD-$SiO_2$ layer using silane gas $SiH_4$, CVD-PSG doped with phosphor P, BPSG using TEOS, or other dielectrics.

Thereafter, the second buffer layer 180 may be formed over the third interlayer dielectric 170. Here, the second buffer layer 180 can be made of a material having an etch selectivity greater than that of the interlayer dielectric. For example, in embodiments, a nitride based material may be used in the second buffer layer 180.

In embodiments, the second buffer layer 180 prevents photoresist poisoning by preventing reactions between the interlayer dielectric and a photoresist layer.

Next, the hard mask 190 may be formed at an upper portion of the second buffer layer 180. The hard mask 190 may be made of a material having an etch selectivity greater than that of the interlayer dielectric. For example, in embodiments, a nitride based material may be used in the hard mask 190.

Subsequently, the via plug 230 and the upper metal wiring 240 can be simultaneously formed by filling the via hole and the trench.

The second buffer layer 180, the third interlayer dielectric 170, and the hard mask 190 can be aligned on the same longitudinal line.

As may be appreciated from the forgoing description, the semiconductor device with a dual damascene pattern according to embodiments prevents photoresist layer poisoning by using the second buffer layer to prevent a reaction between the interlayer dielectric and the photoresist layer.

Embodiments may prevent plasma damage during an etching or ashing process using plasma by using the first buffer layer.

In addition, embodiments which prevent photoresist layer poisoning and plasma damage may also suppress an increase in a capacitance between wirings, and prevent a peeling between layers of the semiconductor device, to thereby increase the yield and the reliability of the semiconductor device.

FIGS. 3 through 9 are views illustrating a method for manufacturing a semiconductor device with a dual damascene pattern according to embodiments.

The method for manufacturing a semiconductor device having a dual damascene pattern according to embodiments may include: preparing a substrate; forming a second interlayer dielectric, a first buffer layer, a third interlayer dielectric, a second buffer layer, and a hard mask; etching the second buffer layer and the third interlayer dielectric; etching the second buffer layer and the first buffer layer; forming a trench and a via hole; and forming an upper metal wiring and a via plug.

Figure 3:
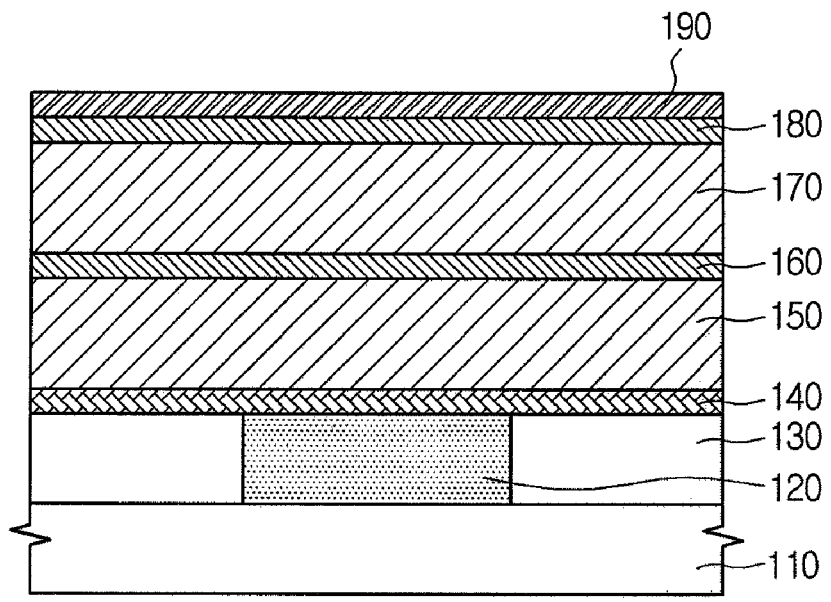
FIGS. 3 through 9 are views illustrating a method for manufacturing a semiconductor device with a dual damascene pattern according to embodiments.

As shown in FIG. 3, a substrate 110 is provided having a first interlayer dielectric 130 including a lower metal wiring 120. The first interlayer dielectric 130 can be formed of TEOS-CVD, PECVD-SiO2, PECVD-SiON, BPSG using TEOS, or other interlayer dielectrics.

Further, in the manufacturing method according to embodiments, the a step of preparing the substrate 110 may further include forming a capping layer 140 between the lower metal wiring 120 and the first interlayer dielectric 130.

As shown in FIG. 3, a second interlayer dielectric 150, a first buffer layer 160, a third interlayer dielectric 170, a second buffer layer 180, and a hard mask 190 are sequentially formed over the first interlayer dielectric 130. The second interlayer dielectric 150 and the third interlayer dielectric 170 may be made of a doped CVD-$SiO_2$ layer using silane gas $SiH_4$, CVD-phospho silicate glass (PSG) doped with phosphor P, borophospho silicate glass (BPSG) using tetraethyl orthosilicate (TEOS), or other dielectrics.

The first buffer layer 160, the second buffer layer 180, and the hard mask 190 can be made of a material having an etch selectivity greater than that of the interlayer dielectric. For example, in embodiments, a nitride based material may be used.

Figure 4:
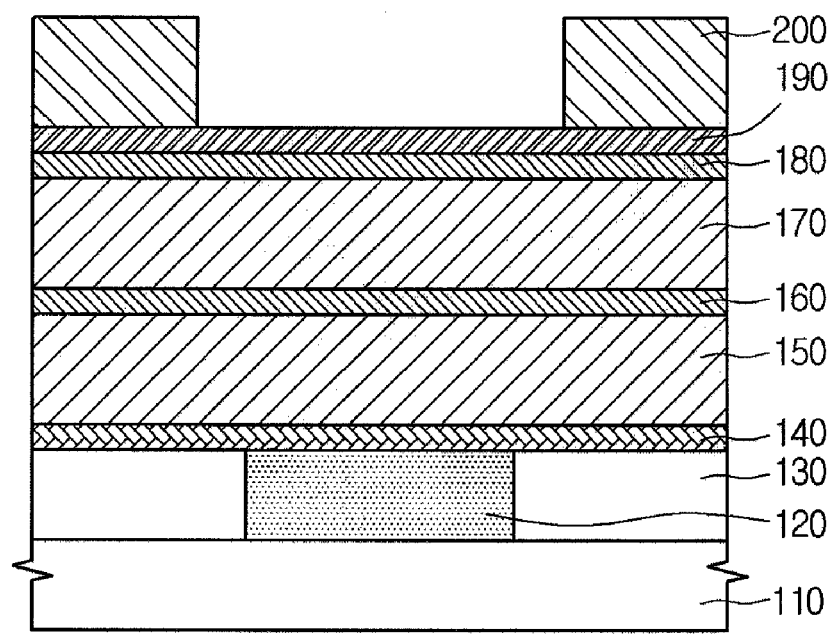

Then, as shown in FIG. 4, a first photoresist layer 200 is deposited and patterned to define a trench pattern region over the hard mask 190. The hard mask 190 is then etched using the first photoresist layer 200 using a mask. The second buffer 180 and the hard mask 190 function to prevent poisoning of photoresist layer 200 by the third interlayer dielectric 170.

Figure 5:
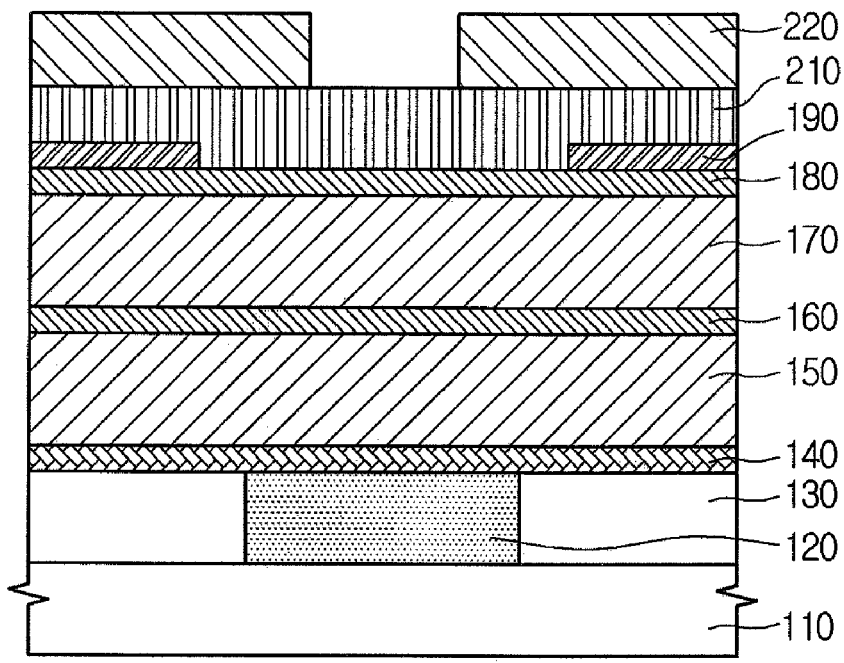
Figure 6:
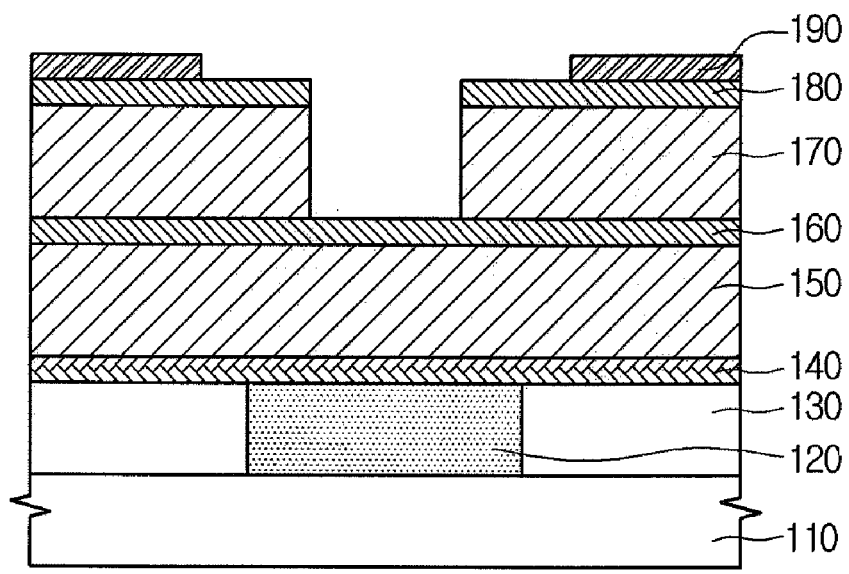

As shown in FIGS. 5 and 6, a second photoresist layer 220 is deposited and patterned to define a via hole over the second buffer layer 180 including the hard mask 190. The second buffer layer 180, the hard mask 190, and the third interlayer dielectric 170 are then etched using second photoresist layer 220 as a mask.

Poisoning of photoresist layer 220 by third interlayer dielectric 170 is prevented by the second buffer layer 180 and the hard mask 190.

Figure 7:
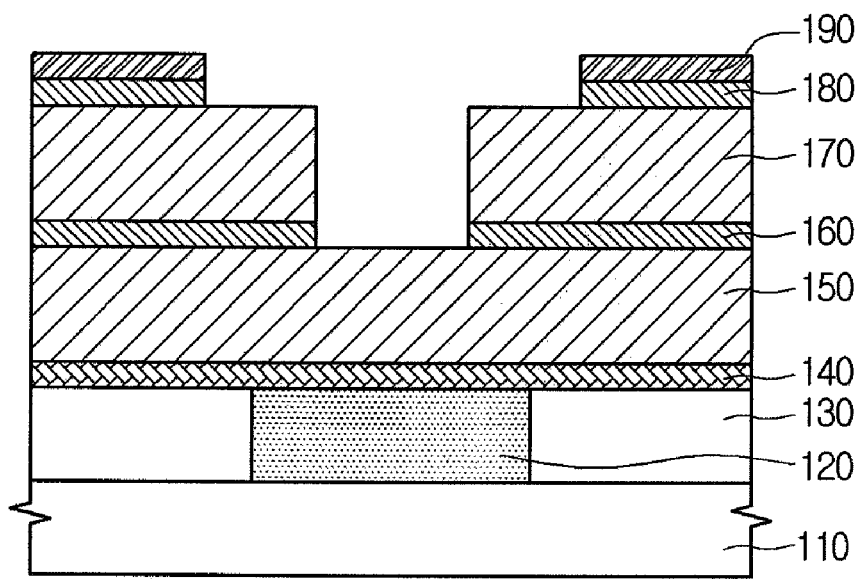

As shown in FIG. 7, the first buffer layer 160 is etched using the third interlayer dielectric 170 as a mask and the second buffer layer 180 is etched using the hard mask 190 as a mask.

Figure 8:
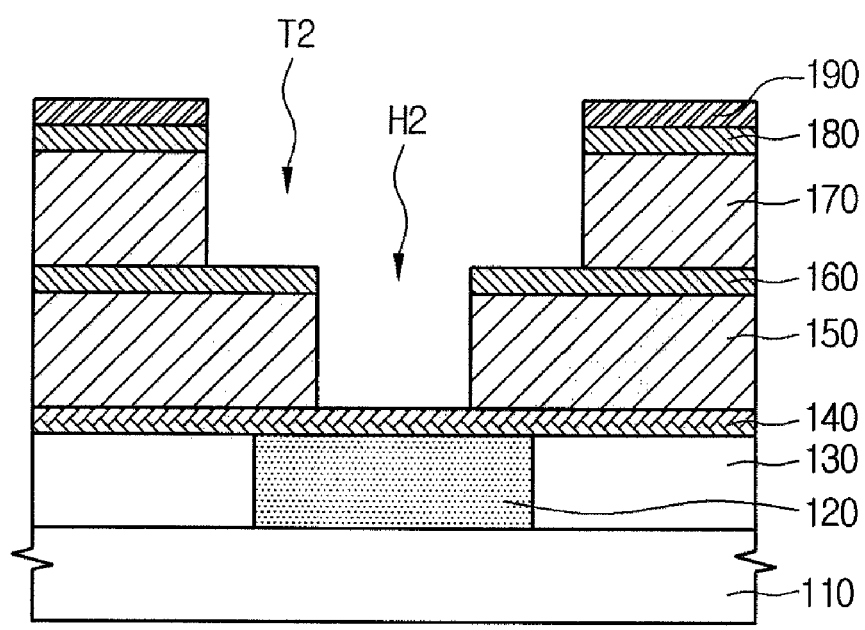

As shown in FIG. 8, the second interlayer dielectric 150 is etched, using first buffer layer 160 as a mask, to form the via hole H2. The third interlayer dielectric 170 is etched, using the hard mask 190 as a mask, to form a trench T2.

Plasma damage due to the via hole etch or photoresist ashing process is prevented by first buffer layer 160.

The exposed portion of first buffer layer 160 may be etched after the formation of the trench and the via hole. If the capping layer 140 is provided between the lower metal wiring 120 and the second interlayer dielectric 150, the exposed portion of capping layer 140 may be etched after the formation of the trench and the via hole.

Figure 9:
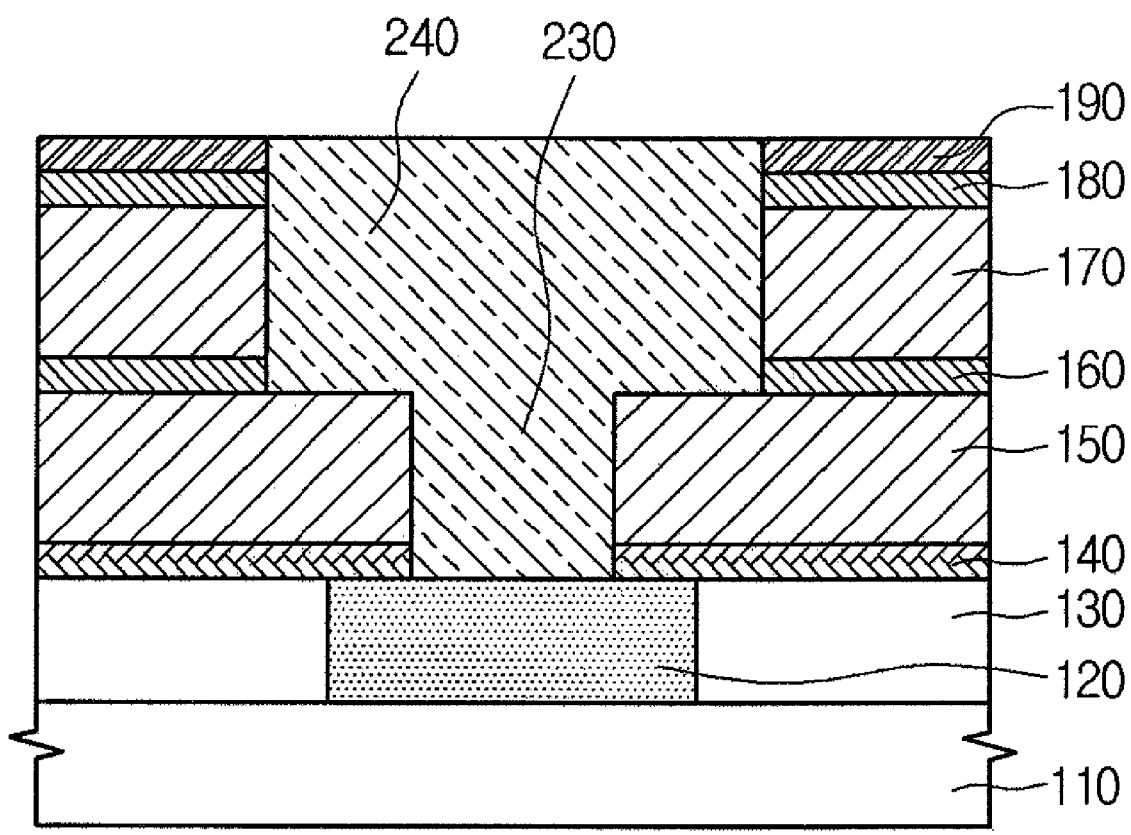

As shown in FIG. 9, the trench and the via hole may be filled with metal to simultaneously form the lower metal wiring 240 and the via plug 230. The metal may be any one selected from the group consisting of Cu, Al, Ag, Au, or W.

Embodiments prevent a photoresist layer poisoning due to interactions between the photoresist and the interlayer dielectric. Plasma damage is prevented during a via hole etch or photoresist layer ashing process by using a buffer layer and a hard mask.

In addition, embodiments prevent the photoresist layer poisoning and the plasma damage from causing an increase in a capacitance between wirings, or a peeling phenomenon between layers or films of the semiconductor device. The yield and the reliability of the semiconductor device are thereby increased.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A semiconductor device comprising:
   a substrate having a first interlayer dielectric layer including a lower metal wiring;
   a second interlayer dielectric layer formed over the first interlayer dielectric layer;
   a first buffer layer formed over the second interlayer dielectric layer;
   a third interlayer dielectric layer;
   a second buffer layer formed over the third interlayer dielectric layer;
   a hard mask formed at an upper portion of the second buffer layer;
   a metal via extending through the second interlayer dielectric layer and the first buffer layer; and
   a metal wiring layer extending through the third interlayer dielectric layer and the second buffer layer.

2. The semiconductor device according to claim 1, further comprising a capping layer formed between the lower metal wiring and the first interlayer dielectric layer.

3. The semiconductor device according to claim 1, wherein the first buffer layer and the second buffer layer are made of a material having an etching selectivity greater than that of the first, second, and third interlayer dielectric layers.

4. The semiconductor device according to claim 1, wherein the first buffer layer, the third interlayer dielectric layer, the second buffer layer, and the hard mask form a sidewall abutting a sidewall of the metal wiring layer.

5. The semiconductor device according to claim 1, wherein the metal is any one selected from the group consisting of Cu, Al, Ag, Au, or W.

6. The semiconductor device according to claim 1, wherein the metal wiring layer fills a trench having a width greater than that of the metal via.

7. A method for manufacturing a semiconductor device comprising:
   preparing a substrate having a first interlayer dielectric layer including a lower metal wiring;
   forming a second interlayer dielectric layer over the first interlayer dielectric layer;
   forming a first buffer layer over the second interlayer dielectric layer;
   forming a third interlayer dielectric layer over the first buffer layer;
   forming a second buffer layer over the third interlayer dielectric layer;
   forming a hard mask over the second buffer layer;
   depositing and patterning a photoresist layer for defining a trench region over the hard mask;
   etching the hard mask using the photoresist layer as a mask to form a trench pattern;

depositing and patterning a photoresist layer for defining a via hole over the second buffer layer including the hard mask;

etching the second buffer layer and the third interlayer dielectric;

simultaneously etching the second buffer layer using the hard mask as an etch mask and etching the first buffer layer using the third interlayer dielectric as an etch mask; and etching a third interlayer dielectric using the hard mask as an etch mask to form a trench, while etching the second interlayer dielectric using the first buffer exposed according to a formation of the trench to form a via hole.

8. The method according to claim 7, further comprising etching the first exposed buffer layer after the formation of the trench and the via hole.

9. The method according to claim 8, wherein the step of preparing the substrate includes forming a capping layer between the lower metal wiring and the first interlayer dielectric, and further comprising etching the capping layer after the formation of the trench and the via hole.

10. The method according to claim 7, wherein the trench and via hole are filled with a metal to form an upper metal wiring and metal via.

11. The method according to claim 10, wherein the metal is any one selected from the group consisting of Cu, Al, Ag, Au, or W.

* * * * *